United States Patent
Lee et al.

(10) Patent No.: US 6,416,318 B1
(45) Date of Patent: Jul. 9, 2002

(54) PROCESS CHAMBER ASSEMBLY WITH REFLECTIVE HOT PLATE AND PIVOTING LID

(75) Inventors: Jae Yun Lee, Milpitas; Lovell C. Chase, III, San Juan Bautista, both of CA (US)

(73) Assignee: Silicon Valley Group, Inc., San Jose, CA (US)

( * ) Notice: Subject to any disclaimer, the term of this patent is extended or adjusted under 35 U.S.C. 154(b) by 165 days.

(21) Appl. No.: 09/593,270

(22) Filed: Jun. 13, 2000

Related U.S. Application Data

(60) Provisional application No. 60/139,560, filed on Jun. 16, 1999, and provisional application No. 60/203,612, filed on May 10, 2000.

(51) Int. Cl.⁷ ............................................. F27D 1/18
(52) U.S. Cl. ................................. 432/247; 118/725
(58) Field of Search ........................... 432/247, 249, 432/250, 253; 219/390; 118/724, 725, 726

(56) References Cited

U.S. PATENT DOCUMENTS

| | | | | |
|---|---|---|---|---|
| 5,011,794 A | * | 4/1991 | Grim et al. .................. | 432/253 |
| 5,514,852 A | * | 5/1996 | Takamori et al. ............. | 432/11 |
| 5,868,850 A | | 2/1999 | Ichishima et al. .......... | 118/725 |
| 5,904,872 A | | 5/1999 | Arami et al. ................ | 219/465 |
| 6,091,056 A | * | 7/2000 | Kannan et al. .............. | 219/390 |
| 6,171,402 B1 | * | 1/2001 | Strodbeck et al. .......... | 118/724 |
| 6,193,507 B1 | * | 2/2001 | White et al. ................. | 432/247 |

FOREIGN PATENT DOCUMENTS

| EP | 0467397 | 7/1991 | ........... H01L/21/00 |
|---|---|---|---|
| WO | WO 99/03135 | 1/1999 | ........... H01L/21/00 |

OTHER PUBLICATIONS

Shigeru, T. "Substrate Heater", Patent Abstracts of Japan, vol. 012, No. 362, Sep. 28, 1988 & JP63116419, May 20, 1988.

Yasuhito, I. "Wafer Housing Case", Patent Abstracts of Japan, vol. 014, No. 112, Feb. 28, 1990 & JP01310555, Dec. 14, 1989.

Katsufusa, F. "Measuring Device for Semiconductor Wafer", Patent Abstracts of Japan, vol. 013, No. 078, Feb. 22, 1989 & JP63260146, Oct. 27, 1988.

Jiro, I. "Sputtering System", Patent Abstracts of Japan, vol. 016, No. 110, Mar. 18, 1992 & JP03285068, Dec. 16, 1991.

Masao, H. "Vapor Phase Reaction Unit", Patent Abstracts of Japan, vol. 009, No. 277, Nov. 6, 1985 & JP60119711, Jun. 27, 1985.

* cited by examiner

*Primary Examiner*—Gregory Wilson
(74) *Attorney, Agent, or Firm*—Wilson, Sonsini Goodrich & Rosati

(57) ABSTRACT

A hot plate assembly includes a base plate, a lid and a housing positioned between the base plate and the lid. The housing, lid and base plate form a process chamber. An insulator is positioned adjacent to the base plate in the process chamber. An air gap is formed at least partially between a bottom surface of the insulator and a top surface of the base plate. A hot plate is positioned adjacent to the insulator in the process chamber. At least a first reflective member is positioned between the hot plate and the insulator.

44 Claims, 6 Drawing Sheets

PROCESS CHAMBER ASSEMBLY WITH REFLECTIVE HOT PLATE AND PIVOTING LID

CLAIM OF PRIORITY APPLICATIONS

This application claims the benefit of priority of U.S. Provisional Application No. 60/139,560, filed Jun. 16, 1999 and U.S. Provisional Application No. 60/203,612 filed May 10, 2000, which applications are fully incorporated herein by reference.

BACKGROUND OF THE INVENTION

1. Field of the Invention

This invention relates in general to the field of wafer processing equipment, and more particularly to bake modules.

2. Discussion of Related Art

Temperature uniformity across a wafer surface is an important factor in many integrated circuit fabrication steps since rate processes used in fabrication are generally temperature dependent. In particular processes, thermal non-uniformity can adversely effect a circuit element's critical dimension size by enlarging it relative to a design goal. Thus, as trends toward smaller integrated circuit critical dimensions continue, temperature uniformity requirements for wafer thermal management systems will become increasingly stringent.

For example, as compared to earlier standards, current temperature uniformity requirements of 0.1° C. across a several hundred millimeters diameter wafer represent a 50% increase in temperature uniformity. Wafer heating units must be able to achieve such temperature uniformity figures of merit over a wide range of process operating temperatures, typically from about 90° C. to several hundred degrees Celsius, and in a manner consistent from wafer-to-wafer.

Thus, due to the limitations of related art, there is a need for methods of efficient, rapid, controllable and uniform thermal management over a wide temperature range. Further, there is a need for an apparatus that provides the desired high performance during both steady state and transient conditions and that is very suitable for easy use within a manufacturing setting. There is a further need for a process module assembly with a lid that is rotatable without being removed from the process module to permit access to an interior surface of the lid.

SUMMARY OF THE INVENTION

Accordingly, an object of the present invention is to provide a hot plate utilized in a process module of semiconductor manufacturing equipment that creates thermal uniformity across a wafer positioned in close proximity to a surface of hot plate.

Another object of the present invention is to provide a hot plate utilized in a process module of semiconductor manufacturing equipment that has thermal uniformity across its top surface.

A further object of the present invention is to provide a hot plate assembly for a bake module that minimizes thermal contamination to its surrounding environment.

Yet another object of the present invention is to provide a hot plate assembly for a bake module that includes a lid, a base plate, a hot plate, an insulator and reflective surfaces.

A further object of the present invention is to provide a hot plate that minimizes thermal contamination to its associated base plate.

Another object of the present invention is to provide a hot plate assembly that minimizes down time for servicing of the bake module.

An object of the present invention is to provide a hot plate assembly that includes reflective surfaces to contain radiative heat losses from the hot plate.

A further object of the present invention is to provide a hot plate assembly that includes air gaps to control convective heat losses from the hot plate.

Yet another object of the present invention is to provide a hot plate assembly for a bake module that includes a lid, a base plate, a hot plate, an insulator, reflective surfaces and air gaps.

A further object of the present invention is to provide a hot plate assembly with air gaps between the insulator and the hot plate, and the hot plate and the lid.

Yet another object of the present invention is to provide a process module assembly with a lid that is rotatable without being removed from the process module in order to permit access to an interior surface of the lid.

Another object of the present invention is to provide a process module assembly with a lid that has an interior surface which can be cleaned without removing the lid from the process module assembly.

A further object of the present invention is to provide a process module assembly that includes a lid supported at a single pivot point.

These and other objects of the present invention are achieved in a hot plate assembly that includes a base plate, a lid and a housing positioned between the base plate and the lid. The housing, lid and base plate form a process chamber. An insulator is positioned adjacent to the base plate in the process chamber. An air gap is formed at least partially between a bottom surface of the insulator and a top surface of the base plate. A hot plate is positioned adjacent to the insulator in the process chamber. At least a first reflective member is positioned between the hot plate and the insulator.

In another embodiment, the present invention a process module assembly includes a base plate, a lid and a housing positioned between the base plate and the lid. The housing, lid and base plate form a process chamber. A lid sealing member is positioned between the housing and the lid. A single lid support is provided with a longitudinal axis that extends from the base plate to the lid. The lid is sufficiently rotatable about the longitudinal axis to permit access to an interior surface of the lid without removal of the lid from the single lid support.

DETAILED DESCRIPTION

Figure 1:
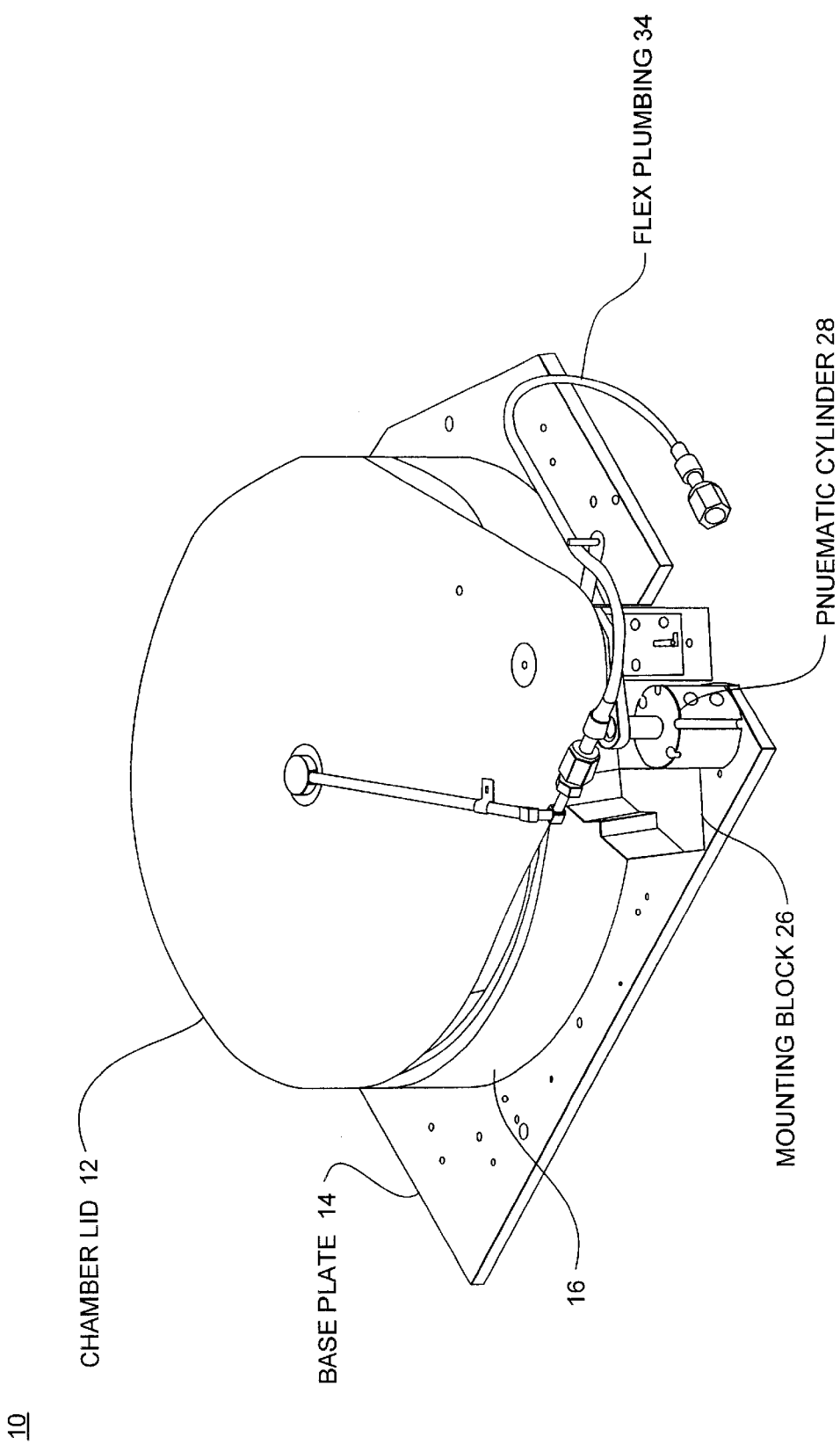
FIG. 1 is a perspective view of one embodiment of a process module of the present invention with a lid that is rotatable about a single pivot point.
Figure 2:
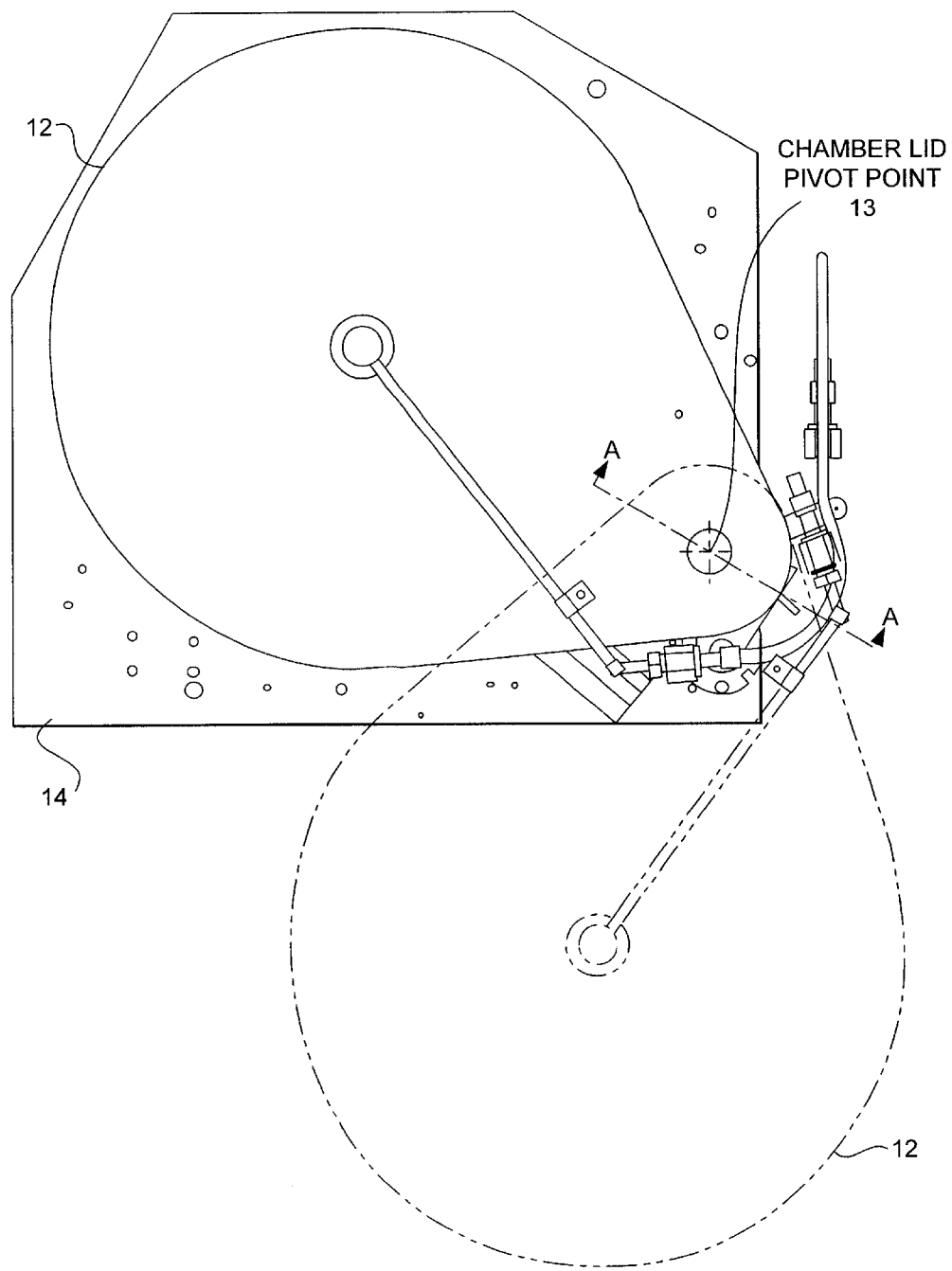
FIG. 2 is a top perspective view of the FIG. 1 process module with the lid rotated about a chamber lid pivot point to allow for cleaning of an interior of the lid.
Figure 3:
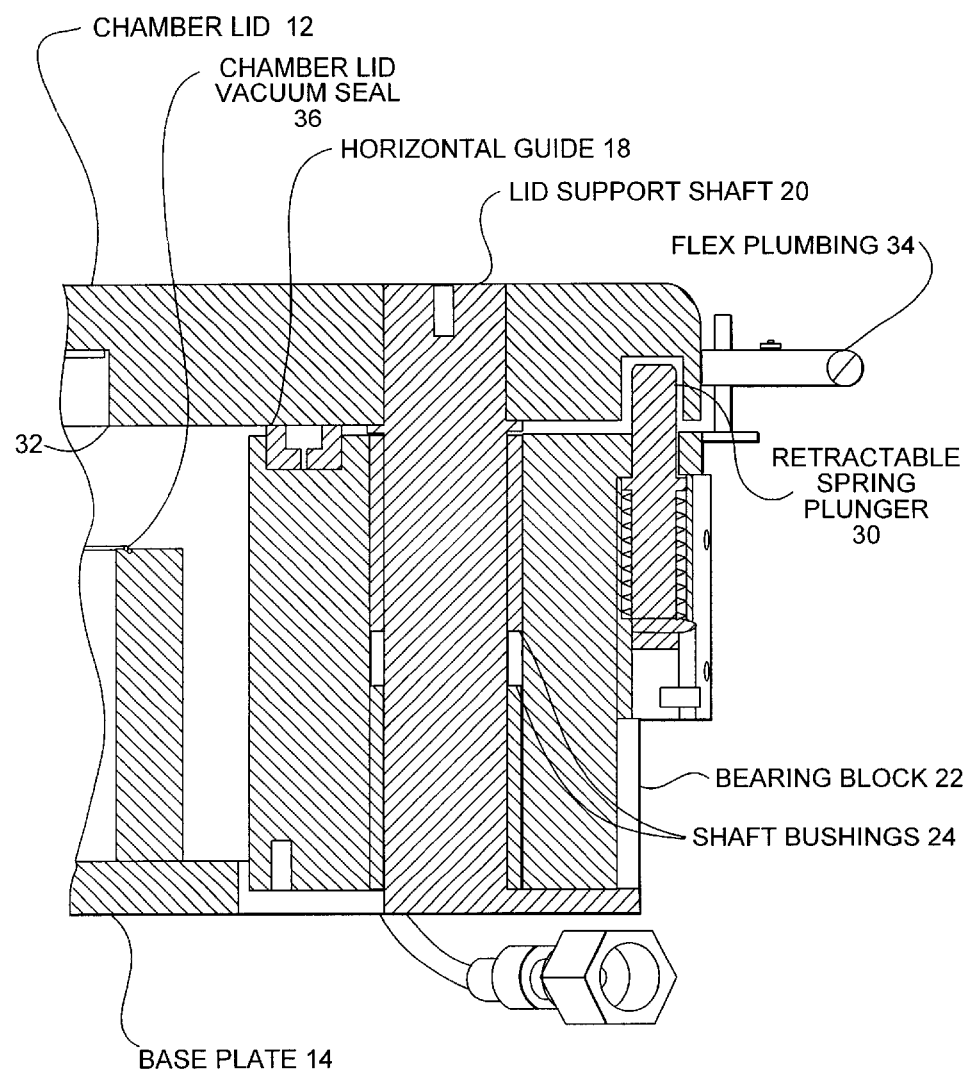
FIG. 3 is a cross-sectional view of a portion of the FIG. 2 process module.

One embodiment of the present invention is a process module assembly 10 for use in semiconductor manufacturing equipment. Suitable process modules include but are not limited to a bake module. As illustrated in FIG. 1, assembly 10 includes a lid 12, a base plate 14 and a housing 16. Lid 12, base plate 14 and housing 16 define a process chamber.

Referring now to FIGS. 1–4, lid 12 is supported in a horizontal plane by a horizontal guide 18 and a vertical shaft 20 at a lid pivot point 13. Shaft 20 is supported in a bearing block 22 with two bushings 24. Together guide 18 and bushings 24 provide support for lid 12. Guide 18 is rigidly attached to a mounting block 26 located on a base plate 14.

Lid's 12 open and close motion can be accomplished with a pneumatic cylinder (see FIG. 1), or other suitable mechanical structure, attached between bearing block 22 and base plate 14. In normal operation lid 12 is constrained from rotating with a suitable device including but not limited to a retractable spring plunger 30 located on bearing block 22. In the up position, cylinder 28 is in its fully extended position. Lid 12 is supported in the horizontal plane by the reaction forces of horizontal guide 18 and bushings 24. Lid 12 can be cleaned or serviced in the "up" or open position. To rotate lid 12 spring plunger 30 is retracted. When spring plunger 30 is retracted lid 12 can be rotated to a position allowing access to clean an internal lid surfaces 32 which can include a shower head or other assembly that delivers a fluidic medium to the chamber.

Bushings 24 allow lid 12 to be rotated about a vertical pivot axis. Substantially constant contact with horizontal guide 18 maintains lid 12 in a horizontal plane. Retracting spring plunger 30 and a rotation of lid 12 is accomplished without removing or disassembling assembly 10. A flexible process gas tube 34 allows movement with lid 12 while remaining fixed (connected) at the opposite end. In the "down" or closed position, a chamber vacuum seal, such as O-ring 36, provides a vacuum tight boundary and sealing surface of the process chamber. A controlled clearance between the lid support shaft and the bushings allows the sealing surface of the lid to lie parallel a top of housing 16. Additionally, the design allows for a small amount of vertical axis relative motion between the lid support shaft and bearing block due to variations in pneumatic cylinder stroke length and compression of the vacuum seal.

Figure 4:
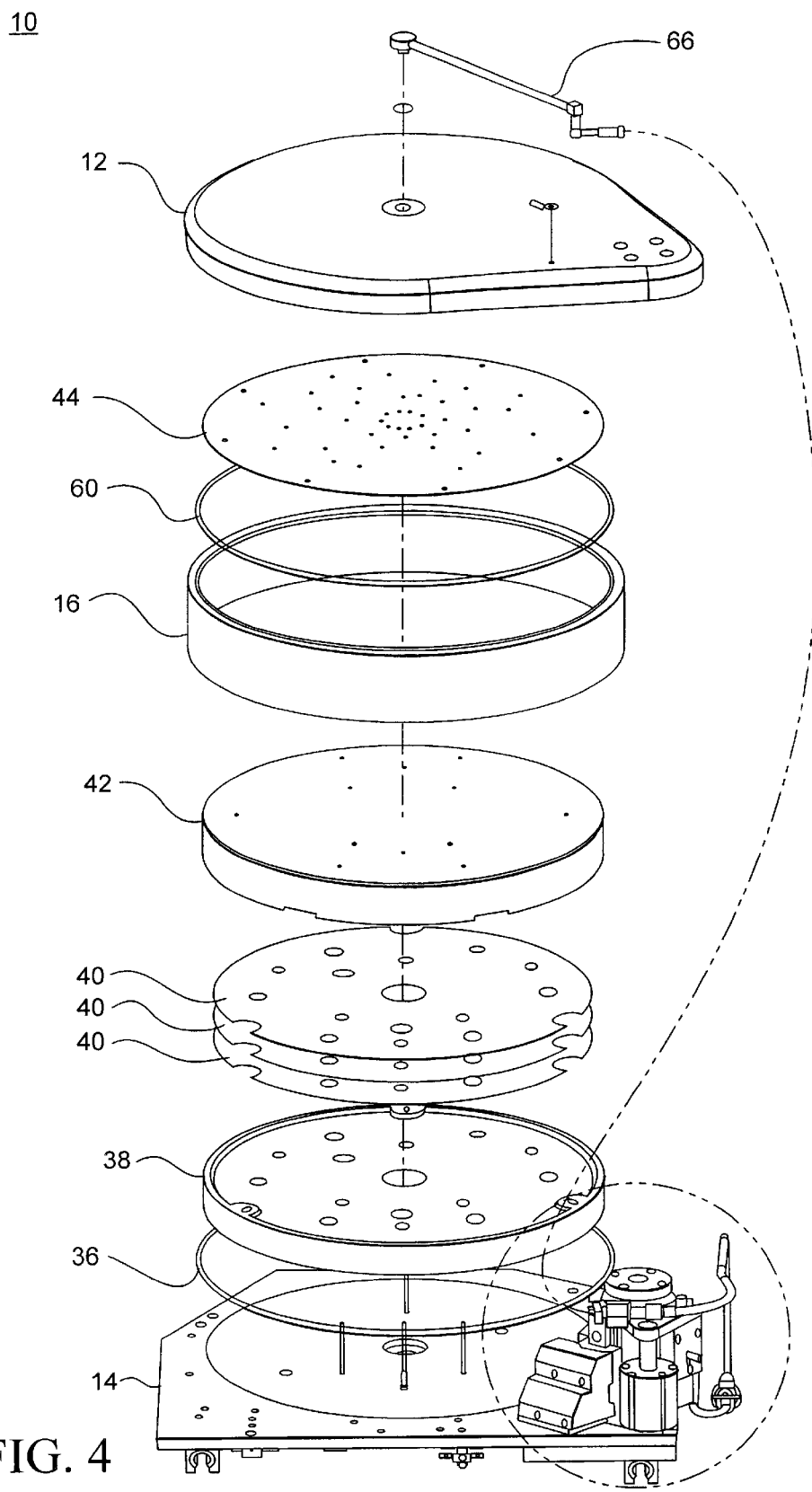
FIG. 4 is an exploded view of one embodiment of the FIG. 1 process module.
Figure 5:
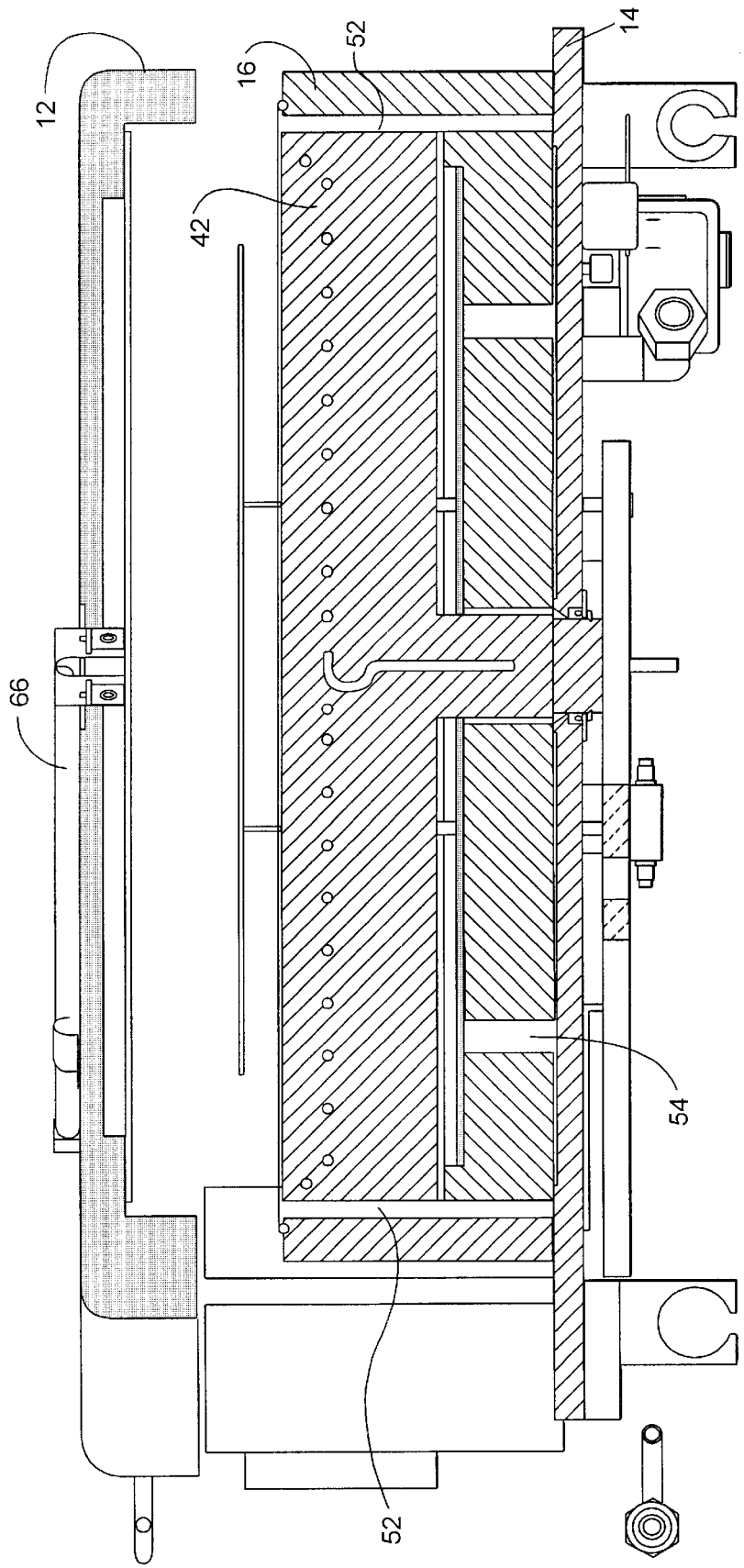
FIG. 5 is a full cross-sectional view of the FIG. 1 process module.
Figure 6:
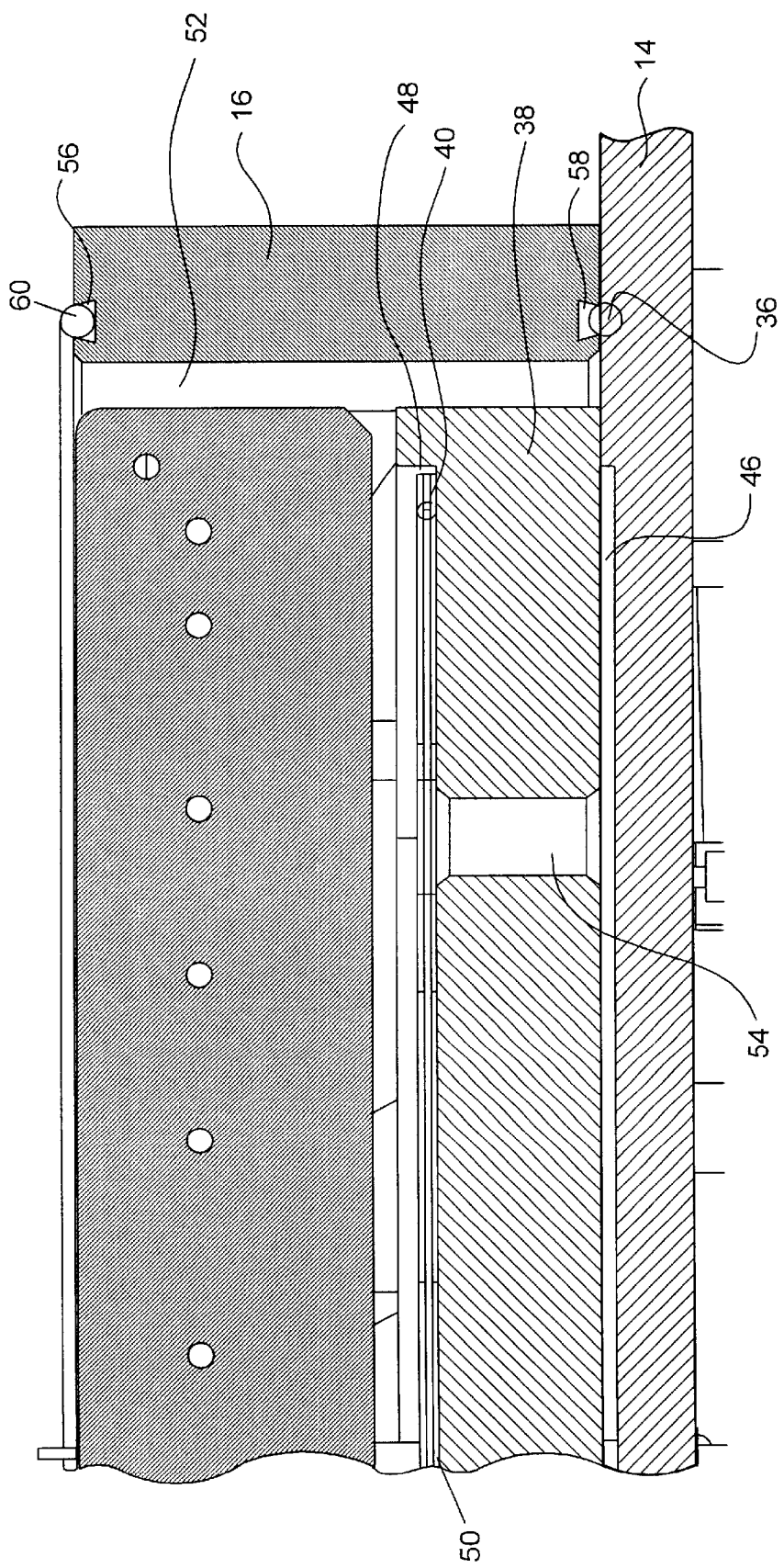
FIG. 6 is a cross-sectional view of a portion of the FIG. 5 process module.

Referring now to FIGS. 4–6, process module assembly 10 is a bake module that includes an insulator 38, one or more reflective members 40, a hot plate 42 and housing 16. Reflective members 40, a hot plate 42, and housing 16. Reflective members 40 can have plate type geometric configurations. Housing 16 has a diameter larger than the diameters of hot plate 42 and insulator 38, and a height that is approximately equal to the height of insulator 38 and hot plate 42. Lid 12 can include a shower head 44. Base plate 14 can include an exhaust port and an assembly to move lid 12, as described in FIGS. 2 and 3. Insulator 38 is positioned on base plate 14 in a manner to create a first air gap 46. First air gap 46 creates a conductive resistance layer between base plate 14 and the remaining elements of assembly 10. The diameter of first air gap 46 can be smaller than the diameter of insulator 38.

Insulator 38 has a top surface with a recess 48. Recess 48 is dimensioned to receive one or more reflective members 40. As illustrated in FIG. 4, three reflective members 40 are included. It will be appreciated that the present invention can include one reflective member 40, or any number of reflective members 40. An air gap 50 is formed between a top surface of insulator 38 and the lower most reflective member 40. Air gap 50 creates a conductive resistance layer. Air gaps are also formed between adjacent reflective members 40 to once again create conductive resistance layers.

The top surfaces of reflective members 40 have high thermal reflectivity and low thermal absorptivity characteristics. The diameters of reflective members 40 are slightly smaller than the diameter of hot plate 42.

An air gap 52 is formed between housing 16 and insulator 38 and hot plate 42. Hot gases surrounding hot plate 42 are removed by traveling from gap 52 and then through exhaust ports 54 that are formed in insulator 38.

Grooves 56 and 58 and formed in top and bottom surfaces of housing 16. O-rings 60 and 36 are received in grooves 56 and 58. O-ring 36 provides a seal between housing 16 and base plate 14, while O-ring 60 creates a seal between housing 16 and lid 12.

Process gases can be introduced to assembly 10 through a gas conduit 66. Shower head 44 receives gases from gas conduit 66 and injects the gases onto a top surface of a wafer positioned adjacent to hot plate 42.

It will be readily apparent to those skilled in the art that this invention is not limited to the embodiments described above. Different configurations and embodiments can be developed without departing from the scope of the invention and are intended to be included within the scope of the claims set forth below.

What is claimed is:

1. A hot plate assembly, comprising:
    a base plate;
    a lid;
    a housing positioned between the base plate and the lid, the housing lid and base plate forming a process chamber;
    an insulator positioned adjacent to the base plate in the process chamber with an air gap formed at least partially between a bottom surface of the insulator and a top surface of the base plate;
    a hot plate positioned adjacent to the insulator in the process chamber; and
    at least a first reflective member positioned between the hot plate and the insulator.

2. The assembly of claim 1, further comprising:
    a first fluid delivery member coupled to the lid, the first fluid delivery member being positioned in the process chamber when the lid is sealed to the housing.

3. The assembly of claim 2, wherein the first fluid delivery member is a shower head.

4. The assembly of claim 2, further comprising:
    a flexible second fluid delivery member extending from an exterior of the lead and coupled to the first fluid delivery member.

5. The assembly of claim 4, wherein the flexible second fluid delivery member is made of a pliable material.

6. The assembly of claim 1, wherein at least a portion of the insulator is distanced from the base plate to create a first air gap in the process chamber.

7. The assembly of claim 6, wherein the diameter of the first air gap is less than a diameter of the insulator.

8. The assembly of claim 1, wherein at least a portion of the insulator is sufficiently distanced from the base plate to create a conductive resistance layer between the base plate and the hot plate.

9. The assembly of claim 1, wherein the insulator has a top surface that includes a recess.

10. The assembly of claim 9, wherein the first reflective member is at least partially positioned in the recess.

11. The assembly of claim 1, wherein at least a portion of the first reflective member is sufficiently distanced from the insulator to create an air gap between the insulator and the first reflective member.

12. The assembly of claim 1, wherein at least a portion of the first reflective member is sufficiently distanced from the insulator to create a conductive resistance layer between the first reflective member and the insulator.

13. The assembly of claim 1, further comprising:
a second reflective member positioned adjacent to the first reflective member.

14. The assembly of claim 13, wherein at least portions of the first and second reflective members are sufficiently distanced to create an air gap between the first and second reflective members.

15. The assembly of claim 13, wherein each of the first and second reflective members has a top surface facing the lid and a bottom surface facing the base plate.

16. The assembly of claim 15, wherein each top surface of the first and second reflective members has a high thermal reflectivity.

17. The assembly of claim 16, wherein each top surface of the first and second reflective members has a low thermal absorptivity characteristic.

18. The assembly of claim 13, wherein each of the first and second reflective members has a diameter than is smaller than a diameter of the hot plate.

19. The assembly of claim 1, further comprising:
an O-ring that creates a seal between the housing and the lid.

20. A process module assembly, comprising:
a base plate;
a lid;
a housing positioned between the base plate and the lid, the housing lid and base plate forming a process chamber;
a lid sealing member positioned between the housing and the lid; and
a single lid support with a longitudinal axis that extends from the base plate to the lid, wherein the lid is sufficiently rotatable about the longitudinal axis to permit access to an interior surface of the lid without removal of the lid from the single lid support.

21. The assembly of claim 20, wherein the single lid support includes an elongated guide and a bearing member.

22. The assembly of claim 21, wherein the bearing member includes at least one bushing.

23. The assembly of claim 21, wherein the elongated guide is rigidly coupled to the base plate.

24. The assembly of claim 20, wherein the single lid support includes a pneumatic cylinder.

25. The assembly of claim 20, further comprising:
a lid restraining member, the lid restraining member minimizing rotational movement of the lid.

26. The assembly of claim 25, wherein the lid restraining member includes a retractable spring plunger coupled to the bearing member.

27. The assembly of claim 20, further comprising:
an insulator positioned adjacent to the base plate in the process chamber with an air gap formed at least partially between a bottom surface of the insulator and a top surface of the base plate;
a hot plate positioned adjacent to the insulator in the process chamber; and
at least a first reflective member positioned between the hot plate and the insulator.

28. The assembly of claim 27, further comprising:
a first fluid delivery member coupled to the lid, the first fluid delivery member being positioned in the process chamber when the lid is sealed to the housing.

29. The assembly of claim 28, wherein the first fluid delivery member is a shower head.

30. The assembly of claim 28, further comprising:
a flexible second fluid delivery member extending from an exterior of the lead and coupled to the first fluid delivery member.

31. The assembly of claim 30, wherein the flexible second fluid delivery member is made of a pliable material.

32. The assembly of claim 27, wherein at least a portion of the insulator is distanced from the base plate to create a first air gap in the process chamber.

33. The assembly of claim 32, wherein the diameter of the first air gap is less than a diameter of the insulator.

34. The assembly of claim 27, wherein at least a portion of the insulator is sufficiently distanced from the base plate to create a conductive resistance layer between the base plate and the hot plate.

35. The assembly of claim 27, wherein the insulator has a top surface that includes a recess.

36. The assembly of claim 35, wherein the first reflective member is at least partially positioned in the recess.

37. The assembly of claim 27, wherein at least a portion of the first reflective member is sufficiently distanced from the insulator to create an air gap between the insulator and the first reflective member.

38. The assembly of claim 27, wherein at least a portion of the first reflective member is sufficiently distanced from the insulator to create a conductive resistance layer between the first reflective member and the insulator.

39. The assembly of claim 27, further comprising:
a second reflective member positioned adjacent to the first reflective member.

40. The assembly of claim 39, wherein at least portions of the first and second reflective members are sufficiently distanced to create an air gap between the first and second reflective members.

41. The assembly of claim 39, wherein each of the first and second reflective members has a top surface facing the lid and a bottom surface facing the base plate.

42. The assembly of claim 41, wherein each top surface of the first and second reflective members has a high thermal reflectivity.

43. The assembly of claim 42, wherein each top surface of the first and second reflective members has a low thermal absorptivity characteristic.

44. The assembly of claim 39, wherein each of the first and second reflective members has a diameter than is smaller than a diameter of the hot plate.

* * * * *